United States Patent [19]

Uchida et al.

[11] Patent Number: 5,792,592
[45] Date of Patent: Aug. 11, 1998

[54] PHOTOSENSITIVE LIQUID PRECURSOR SOLUTIONS AND USE THEREOF IN MAKING THIN FILMS

[75] Inventors: Hiroto Uchida; Nobuyuki Soyama, both of Colorado Springs, Colo.; Kensuke Kageyama; Katsumi Ogi, both of Saitama, Japan; Michael C. Scott, Colorado Springs, Colo.; Larry D. McMillan, Colorado Springs, Colo.; Carlos A. Paz de Araujo, Colorado Springs, Colo.

[73] Assignees: Symetrix Corporation, Colorado Springs, Colo.; Mitsubishi Materials Corporation, Japan

[21] Appl. No.: 653,444

[22] Filed: May 24, 1996

[51] Int. Cl.[6] .................................................. G03F 7/30
[52] U.S. Cl. ........................ 430/313; 430/270.1; 430/320; 430/325
[58] Field of Search ................................ 430/313, 370.1, 430/320, 325

[56] References Cited

U.S. PATENT DOCUMENTS

| | | | |
|---|---|---|---|
| 4,332,879 | 6/1982 | Pastor et al. | 430/272 |
| 5,021,398 | 6/1991 | Sharma et al. | 505/1 |
| 5,519,234 | 5/1996 | Paz de Araujo et al. | 257/295 |
| 5,627,013 | 5/1997 | Kamisawa | 430/325 |

FOREIGN PATENT DOCUMENTS 6308721   4/1994   Japan ......................... C04B 41/00

Primary Examiner—Janet C. Baxter
Assistant Examiner—Rosemary Ashton
Attorney, Agent, or Firm—Duft, Graziano & Forest, P.C.

[57] ABSTRACT

A photosensitive liquid solution is used to make thin films for use in integrated circuits. The photosensitive liquid solution contains a photo initiator, and solvent, and a mixture of metals bonded to free-radical-susceptible monomers. The metals are mixed in amounts corresponding to the desired stoichiometry of a metal oxide thin film that derives from the. The photosensitive liquid solution is applied to a substrate, soft baked, and exposed to ultraviolet radiation under a photo mask. The ultraviolet radiation patterns the soft-baked film through a free radical polymerization chain reaction. A solvent etch is used to remove the unpolymerized portion of the polymerized film. The remaining thin film pattern is annealed to provide a patterned metal oxide film.

28 Claims, 7 Drawing Sheets

PHOTOSENSITIVE LIQUID PRECURSOR SOLUTIONS AND USE THEREOF IN MAKING THIN FILMS

BACKGROUND OF THE INVENTION

1. Field of the Invention

The invention pertains to methods and materials for making thin films in the construction of electronic devices and optical devices. More particularly, the films derive from liquid metal organic compositions or metal organic complexes that undergo a free radical polymerization reaction when exposed to electromagnetic radiation.

2. Statement of the Problem

Sol-gel solutions are used to make thin films for both optical devices and integrated circuit devices. These solutions include a mixture of metal alkoxides in an organic solvent. The metal alkoxides are mixed in proportions corresponding to a desired mixture of metals in films that derive from a given solution. Acid and water are added to initiate an acid catalyzed condensation polymerization reaction that gels the solution. The gelled solution has an increased film strength making it competent for application to an appropriate substrate. The applied film is dried and annealed in an oxygen environment to produce a metal oxide thin film.

The molarity and quality of sol-gel solutions varies depending upon whether the solution will be applied to an optical substrate or an integrated circuit substrate.

Optical metal oxide films typically have a thickness ranging from 5000 Å to 10,000 Å. In contrast, integrated circuit films are normally less than 3000 Å thick. Integrated circuit films require better film integrity and consistency than optical films. Shorts or inconsistent electronic performance leading to microscopic defects or even larger defects have no effect on the performance of an optical device; however, microscopic defects in an integrated circuit thin film will generally cause catastrophic failure of the afflicted integrated circuit component. Furthermore, integrated circuit films are covered with additional layers and subjected to additional thermal processing, as compared to optical films. Thus, repeat thicknesses of integrated circuit quality films can sometimes be used in optical devices, but thick, rough optical films cannot be used in integrated circuit devices.

A significant drawback in the use of sol-gel solutions is their rapid deterioration due to ongoing polymerization of the metal alkoxides in solution. The solutions typically become too thick to use within a matter of hours or days after the addition of water and acid. Shelf life of the solutions is often short even if no water or acid are added, because the solutions normally contain a small amount of water that facilitates the condensation reaction. The film thicknesses (and electrical performance) in the devices produced from these solutions are, accordingly, inconsistent due to the changing gel strength of the solutions. Thus, sol-gel solutions should be prepared on-site at a manufacturing facility just before the solutions are required for use.

Problems arise in manufacturing processes that utilize sol-gels because variations in sol-gel quality can corrupt a significant run of production unless changes in the gel quality are closely monitored. Manufacturers prefer to buy premixed chemicals from a supplier having the requisite equipment that is required to assure high purity and exact stoichiometry of the precursor solutions. Manufacturers often cannot rely upon suppliers to provide sol-gels due to the criticality of the solution quality.

Thin films may require patterning before they are useful, and this statement is particularly true of integrated circuit films. In integrated circuit manufacture, the patterning process is a complicated and expensive one that normally requires the application of a photo resist layer, exposure of the resist through a mask to define the device pattern, etching to remove thin film materials, and removal of the remaining resist in a solvent wash. A simpler and less expensive patterning process is needed.

Soyama et al., *The Formation of a Fine-Patterned Ferroelectric Thin-Film From a Sol-Gel Solution Containing a Photo-Sensitive Water Generator*, Proceedings Of The International Symposium On Applied Ferroelectrics (1995), reports the addition of o-nitrobenzyl alcohol to a PZT sol-gel solution. Soyama et al apply the solution to a silicon substrate and expose it to masked ultraviolet light. The mask prevents polymerization of selected portions of the film by blocking ultraviolet radiation. The unexposed portions of the film on the substrate do not polymerize.

Soyama et al develop the exposed substrate by washing it with a 1:1 mixture of 2-methoxyethanol and 2-propanol to leave a fine micro pattern over the area that was polymerized by exposure to ultraviolet radiation. The micro pattern consists of a polymerized PZT precursor film that is insoluble in the developing solution. Thus, the unpolymerized film area washes away in the developing solution, while the polymerized area remains on the substrate. The o-nitrobenzyl alcohol generates water upon exposure to ultraviolet radiation. In turn, this water expedites the sol-gel condensation reaction. Soyama et al presume that the o-nitrobenzyl alcohol enhances the degree of polymerization by at least two other reactions as well.

The Soyama et al article reports a significant advance in the art, but does not overcome the fundamental drawbacks of sol-gel solutions. Furthermore, the resolution or shape of the pattern improves with exposure time, but needs improvement.

Uchida et al, *Characterization Of Self-Patterned $SrBi_2Ta_2O_9$ Thin Films From Photo-sensitive Solutions*, International Symposium On Integrated Ferroelectrics (1996) reports the patterning of strontium bismuth tantalate films that were is prepared from a proprietary process using a photosensitive precursor solution. Photomicrographs of the resultant thin films show the formation of dot patterns, e.g., of a 1×1 micron size. The patterns sometimes have tapered edges that lack sharp corners and show signs of bubbling or porosity.

There remains a true need for photosensitive precursor solutions that have a long shelf life and improve the resolution of pattern details.

SUMMARY OF THE INVENTION

The present invention overcomes the problems outlined above by providing photosensitive metalorganic solutions that simplify the thin film patterning process by eliminating at least one step, e.g., the reactive ion etching step, the resist removal step, or the resist application step. The solutions have a long shelf life, and result in improved pattern resolution as compared to prior photosensitive patterning techniques. In contrast to prior sol-gel photosensitive precursor solutions that polymerize by a condensation reaction, the solutions of the present invention polymerize by a free radical chain reaction.

The photosensitive solutions are used to make integrated circuit films and optical films. The solutions are applied to a substrate where they form a liquid film. The film is patterned by exposure to ultraviolet radiation, which initiates a free radical polymerization reaction. Unexposed portions of the film are washed away in a solvent rinse to leave a pattern of high resolution on the substrate. The pattern is dried and annealed to leave a metal oxide layer.

The solutions include a monomer or plurality of monomers each having a metal bonded to a free radical polymerizing agent. The solutions also include a free radical photo initiator. Thus, exposure to light initiates a free radical polymerization chain reaction through the photo initiator, which carries the reaction to the free radical polymerizing agent. In many instances, the free radical polymerizing agent is also sensitive to light and can also be used as the free radical photo initiator. The monomers may be different, in which case a copolymer is produced, or the monomers may be the same. As used herein, the term "polymer" includes polymeric substances made of identical monomers and copolymers made of different monomers, e.g., dimers and trimers.

The metal monomers are preferably mixed in proportions that provide a metal oxide having a desired stoichiometry upon annealing of the polymerized solution film. The mixtures do not necessarily reflect the exact proportions in the desired metal oxide because the ideal solution includes excess amounts of some metals to account for anticipated metal volatilization losses in the anneal. For example, bismuth is particularly volatile, and compensation requires the addition of an excess bismuth amount ranging from 5% to 10%. Compensation for tantalum losses can require the addition of an excess 2% amount of tantalum in the solution. Compensation for metal volatilization losses is not absolutely required to practice the invention. The solutions may be mixed to reflect the exact stoichiometric proportions of the desired metal oxide; however, the compensation of solutions to account for metal volatilization losses is a process optimization step that can lead to considerable improvement in the performance of electrical components derived from the process.

The observed polymerization results from a free radical attacking the carbon to carbon double bond of an alkene monomer. Thus, any alkene could be used in the invention. Acrylates, vinylic compounds, and unsaturated alkenyl carboxylic acid derivatives are preferred for their high degree of polymerization. Metal acrylates are most preferred because they enhance the degree of polymerization, and the resultant polymers resist washing in polar organic solvents. A list of preferred free radical-susceptible monomers includes metal acrylates and their substituted derivatives; metal polyethyleneglycol(meth)acrylates and their substituted derivatives; metal phthalic acid polyethyleneglycol acrylates and their substituted derivatives; metal unsaturated carboxylic acids and their derivatives; ethyl acrylates; metal alkoxy acrylates; and vinylic metal complexes. Especially preferred metal acrylates include metal glydicidyl methacrylates, metal succinic acid monohydroxyethyl acrylates, metal salts of sorbic acid, metal 2-ethyl-2-hexenoates, and mixtures of these compositions. Vinylic metal complexes are also preferred over regular alkenes, but are less preferred than acrylates. Metal N-vinyl-2-pyrrolidone complexes are especially preferred vinylic metal compositions.

Useful metals for practicing the present invention include the transition metals, especially, scandium, titanium, vanadium, chromium, manganese, iron, cobalt, nickel, copper, yttrium, zirconium, niobium, molybdenum, technetium, ruthenium, rhodium, palladium, silver, lanthanum, hafnium, tantalum, tungsten, rhenium, osmium, iridium, platinum, gold, and actinium; the lanthanide series metals, especially, cerium, praseodymium, neodymium, promethium, samarium, europium, gadolinium, terbium, dysprosium, holmium, erbium, thulium, ytterbium, and lutetium; the rare earth metals including calcium, strontium, barium, and radium; and the alkali metals including lithium, sodium, potassium, rubidium, cesium, and francium. Other metals for use in the present invention include magnesium, zinc, cadmium, aluminum, gallium, indium, thallium, germanium, lead, tin, antimony, and bismuth. Nonmetallic elements including selenium, tellurium, phosphorous, silicon, and boron are also useful in the present invention.

A method of making the metal acrylates includes reacting a metal alkoxide with the acrylate in the presence of an organic solvent to yield a metal alkoxy acrylate followed by distillation of the reaction solution to eliminate alcohol and water. Distillation also drives the reaction to substantial completion by eliminating alkoxide ligands from the metal alkoxide, and then eliminating the alcohol byproduct. The acrylate substitutes for one of the alkoxy groups attached to the metal, and bonds with the metal to form a carboxylate salt. Bismuth acrylates exhibit thermal sensitivity, and are preferably added to the solution after the distillation step to prevent dissociation of the bismuth from the organic ligand. Bismuth acrylates are especially useful in forming layered superlattice materials.

Examples of preferred metal oxides that may be obtained from the solutions include layered superlattice materials and perovskites. The term "layered superlattice materials" refers to a class of materials that spontaneously generate intercollated sublayers during an anneal into repetitive layering sequences. Layered superlattice materials are normally ferroelectric, but not all of them are ferroelectric at room temperature. The most preferred layered superlattice materials include strontium bismuth tantalate, strontium bismuth niobate, and strontium bismuth niobium tantalate. The most preferred perovskite is barium strontium titanate.

An ultraviolet-sensitive photo initiator is added to the solution. The photo initiator functions as a source of free radicals to initiate the free radical chain reaction. Suitable photo initiators include 1-hydroxy-dimethylmethylphenylketone, 2,2-dimethoxy-2-phenylacetophenone, 1-hydroxy-cyclohexylphenylketone, 2,2'-azobis(2-methylproionitrile), 2,2-diethoxyacetophenone, 1-phenyl-2-hydroxy-2-methylpropane-1-one, 2-methyl-1-(4-methylthiophenyl)-2-molphorino-propane-1-one, 2,4,6-(trimethyl)benzoil diphenylphosphine oxide, benzoin ethers, and hydroxyacetophenones. Examplary benzoin ethers include methylbenzoinmethylether, ethylbenzoinethylether, butylbenzoinbutylether, and iso-butylbenzoinisobutylether. Examplary hydroxyacetophenones include 2-hydroxy-2-methyl-1-phenyl-propane-1-one, 1-(3,4-dimethyl)-2-hydroxy-2-methylpropane-1-one, and 1-(4-isopropyl)-2-hydroxy-2-methyl-propane-1-one.

Other features, objects, and advantages of the present invention will be apparent to those skilled in the art upon a reading of the description below together with the accompanying drawings.

DETAILED DESCRIPTION OF THE PREFERRED EMBODIMENT

Figure 1:
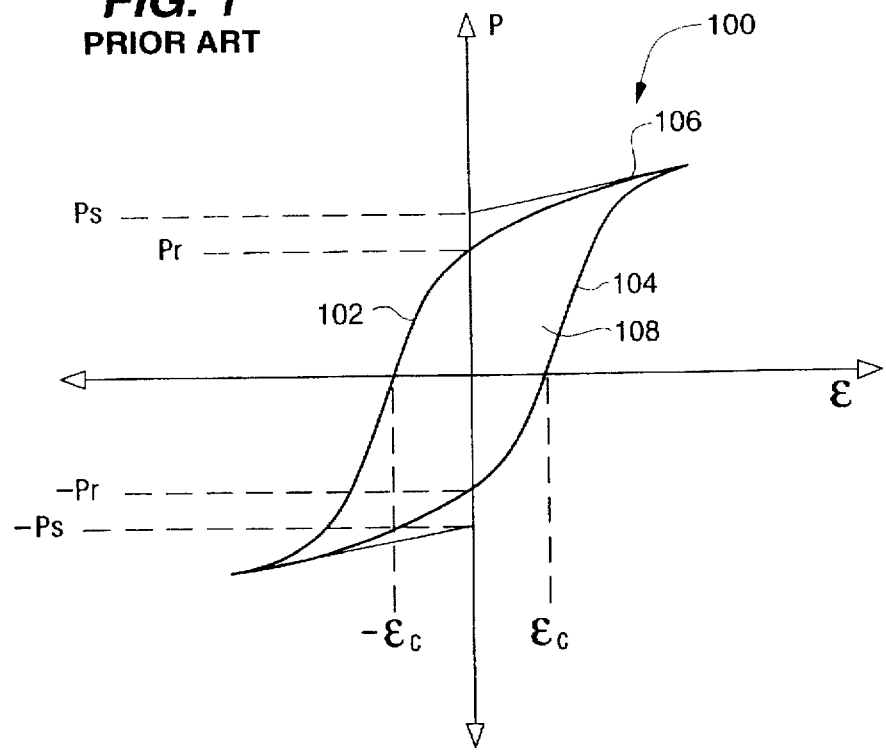
FIG. 1 depicts an integrated circuit substrate in sequential stages of thin film formation according to the present invention.

FIG. 1 depicts a substrate 100 in sequential stages of thin film formation according to the present invention. Substrate 100 is preferably a silicon substrate, but may be any type of integrated circuit or optical substrate, e.g., gallium arsenide, ruby, sapphire, or quartz glass. The term substrate is sometimes used ambiguously in this art. A "substrate" is hereby defined to mean the base supporting layer, e.g., a silicon wafer, in addition to any intervening layers that support subsequent layers. Thus, substrate 100 includes the wafer plus any other layers deposited on the wafer. FIG. 1 does not depict these other layers, but they may include platinum, titanium, silicon oxide, silicon nitride, titanium oxide, and layers of any other material that is used to form integrated circuit devices. These layers together all act as a substrate to support the thin film that is deposited according to the present invention.

A vial 102 filled with photosensitive liquid solution is used to place drops of the solution on the surface 104 of substrate 100. These drops form a liquid film 106 having undesirable thickness variations over surface 103. The application of solution occurs in a conventional spin-coating machine 108.

After application of the solution, substrate 100 is spun at about 600 to 3000 rpm. The spinning removes the irregularities in liquid film 106 to produce a smoothed liquid film 110, which may optionally be baked at low temperatures before proceeding to subsequent steps.

A photo mask 112 is aligned with substrate 100 and positioned between substrate 100 and ultraviolet radiation source 114 between substrate 100. Ultraviolet radiation source 114 is activated to emit ultraviolet radiation 116. Photo mask 112 blocks the portion of ultraviolet radiation impinging upon ultraviolet-blocking mask portion 118, and allows the passage of ultraviolet radiation through mask opening 120. The portion of ultraviolet radiation passing through mask opening 120 impinges upon substrate 100 to polymerize a portion of uniform film, and produces a selectively polymerized film 122.

Substrate 100 is subsequently placed in a developer 124, i.e., a tank or bath filled with a solution that rinses unpolymerized portions of selectively polymerized film 122 away from substrate 100. The development of selectively polymerized film 122 leaves a patterned polymerized film 126 atop substrate 100. Film 128 results from the development of selectively polymerized film 122 if mask 112 is altered to substitute ultraviolet-blocking structure for mask opening 120 and to substitute a mask opening for ultraviolet-blocking structure 118.

Figure 2:
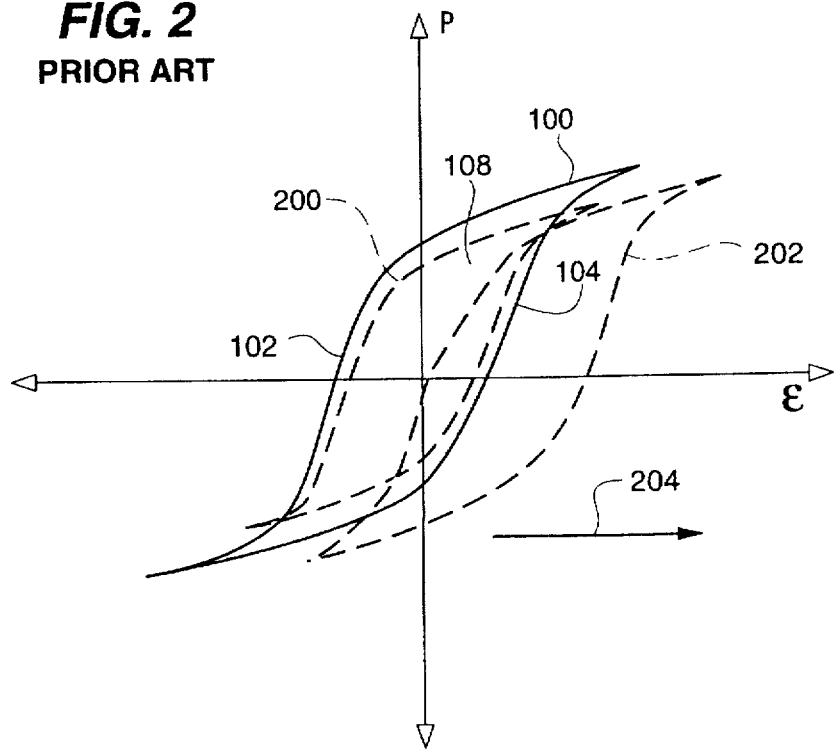
FIG. 2 depicts a schematic process diagram for use in making thin film devices according to the present invention.

FIG. 2 depicts a process schematic diagram of the processing steps that are conducted on substrate 100. The discussion of FIG. 2 provides additional detail with respect to the discussion of FIG. 1. Process P200 shows exceptionally good results when used in the production of integrated circuits.

Step P202 includes providing substrate 100. As indicated above, substrate 100 may be any type of integrated circuit substrate or optical substrate together with any layers deposited on the substrate prior to the deposition of subsequent layers.

Step P204 includes preparing a photosensitive liquid solution. The photosensitive liquid solution contains at least one alkene or metal acrylate and a photo polymerization initiator dissolved in an organic solvent. The photosensitive liquid solution preferably contains a plurality of metal acrylates in a mixture that provides a desired stoichiometry for a solid metal oxide material which derives from the liquid solution. Examples of preferred metal oxides include perovskites and layered superlattice materials.

In step P206, the photosensitive liquid solution of step P204 is applied to the substrate of step P202. The preferred form of deposition of spin-on deposition in which a few drops of the photosensitive liquid solution from step P204 are applied to form film 104 as shown in FIG. 1. The substrate is subsequently spun at about 600 rpm to 3000 rpm for thirty seconds to yield the uniform film 110 as shown in FIG. 1. The most preferred rotational velocity is 1500 rpm. Other liquid deposition techniques, e.g., misted deposition techniques can also be used to deposit the liquid solution.

In step P208, the spun-on film 110 is subjected to a pre-bake on a hot plate in air at a temperature ranging from 80° C. to 150° C. for one to three minutes. The most preferred pre-baking conditions are 100° C. for one minute. This prebaking step stabilizes the film for use in subsequent steps, and is also referred to as a soft-bake because the resultant film 122 (see FIG. 1) is amorphous and contains metal acrylates in a substantially unpolymerized form.

Step P210 includes exposing the dried film from step P208 to ultraviolet radiation. Deep ultraviolet radiation having a wavelength ranging from 250 nm to 300 nm is preferred, as is a total energy delivery of at least about 500 mili-Joules during the term of exposure. The radiation wavelength and energy delivery may be varied, as required for interaction with a selected photo initiator. Prior to such exposure, mask 112 (see FIG. 1) is aligned with substrate 100 using a conventional contact aligner. The ultraviolet radiation impinges upon the photo initiator remaining in the solution film. The photo initiator, accordingly, undergoes homolysis to form a pair of free radicals. These free radicals attack the carbon to carbon double bonds in the alkene or metal acrylate to perpetuate a free radical polymerization reaction. Photo initiated free radical polymerization chain reactions are well known.

Step P212 includes developing the selectively polymerized film by washing or rinsing the wafer with a developer solution to remove unpolymerized portions of film 122 (see FIG. 1). The developer solution is preferably an organic solvent, and more preferably a polar organic solvent. Alcohols are particularly preferred. The most preferred developer solution is a 1:1 mixture of 2-methoxyethanol and isopropyl alcohol, which is applied at room temperature for a time ranging from ten to sixty seconds.

In step P214, steps P206–P210 are optionally repeated until the thin film (126 or 128 of FIG. 1) has reached a desired thickness. Care must be taken when aligning the mask 114 with the substrate 100 each time in step P210, or else the mask alignment error causes misalignment between the newly deposited film and the underlying film. Each application of a 0.15 molar liquid solution in step P206 increases film thickness of the final metal oxide material by about 1500 Å.

Step P216 includes drying the patterned film after development. Substrate 100 is typically placed on a hot plate in air and dried at a temperature ranging from 100° to about 300° C. for a time ranging from ten seconds to five minutes. The most preferred drying procedure is a multi-staged drying procedure. The wafer bearing the patterned film is placed on a 140° C. hot plate for one minute followed by 260° C. for four minutes. The final drying step includes a brief exposure to rapid thermal processing apparatus providing 725° C. for thirty seconds under an oxygen flow of 5 cc/minute.

In step P218, substrate 100 (see FIG. 1) bearing patterned film 126 or 128 is furnace annealed at a temperature ranging from 600° to 850° C. The most preferred anneal profile is 800° C. under an oxygen flow for one hour.

Step P220 includes completing the integrated circuit device. This completing step entails the deposition of additional layers together with the removal or patterning of the additional material, as required. For example, film portion 126 (see FIG. 1) may be the dielectric layer of an integrated circuit capacitor, the ferroelectric layer of a nonvolatile ferroelectric memory, the gate of a ferroelectric transistor, or any other integrated circuit component.

Figure 3:
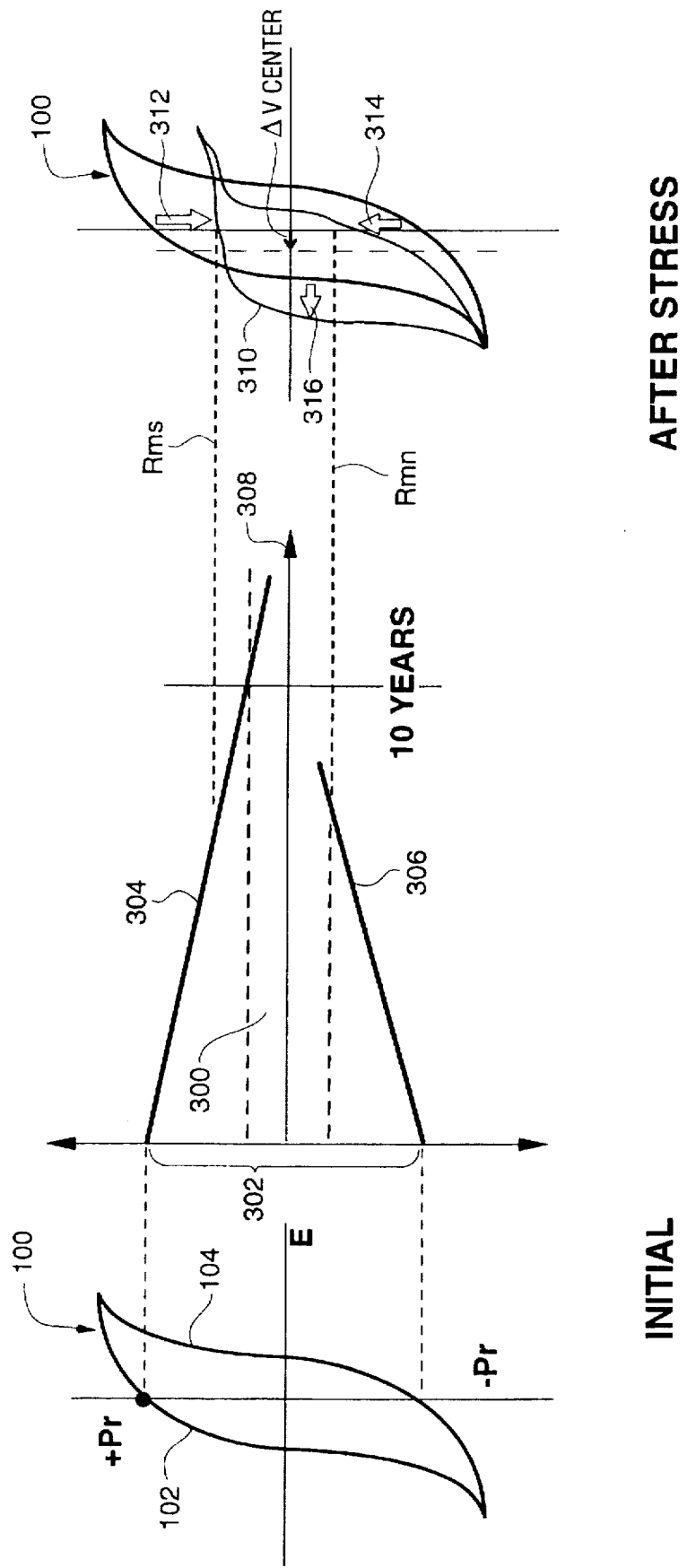
FIG. 3 depicts a generalized free radical polymerization chain reaction.

FIG. 3 depicts a generalized ultraviolet initiated free radical polymerization reaction involving a metal acrylate in step P210. $M_1$ represents a metal having a valence of m. $M_2$ represents a metal having a valence of n. (Rad). represents a free radical which typically originates from the photo initiator, but may also be a metal acrylate free radical. R and R' are alkyl, alkenyl, carboxyl, acrylyl or combinations of these groups. R and R' preferably have a carbon number ranging from one to seven. Single barbed arrows are used to show the movement of electrons.

FIG. 3 shows that, in P210A, ultraviolet radiation attacks the bond between two future radicals (Rad). The bond undergoes homolytic cleavage to produce a pair of radicals (Rad).. In P210B, one of the radicals attacks the alkene bond in the metal acrylate. The radical adds itself to one of the carbons where the double bond formerly existed, and the other carbon becomes a radical. In P210C, a pair of acrylate radicals add together. This addition frees the radical groups that formerly attacked the alkene double bond in P210B. Other free radical addition reactions also occur, as will be understood by those skilled in the art. For example, an acrylate radical can also attack the alkene double bond of another metal acrylate. Other reactions also occur, such as sol-gel condensation reactions when alkoxygroups are present in addition to acrylyl groups in the monomer; however, sol-gels lack the aspect of free radical polymerization. The carboxyl group of the acrylate also enhances stability of the polymerized thin film by forming coordination complexes, i.e., it acts as a chelating agent.

Figure 4:
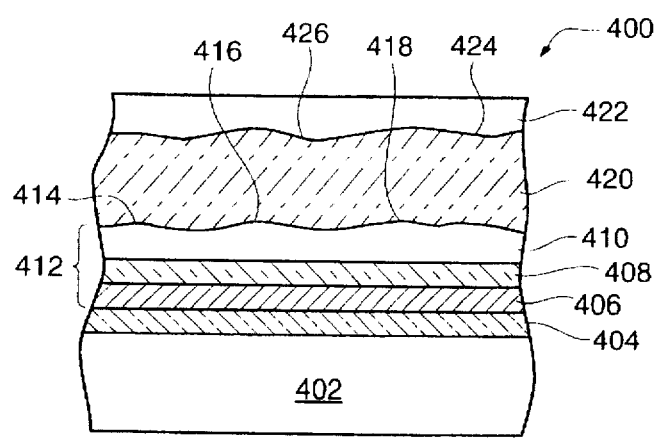
FIG. 4 depicts a process schematic diagram for use in making a photosensitive liquid solution of the type used in the FIG. 2 process.

FIG. 4 depicts a process schematic diagram P300 showing additional detail for step P204 of FIG. 2, i.e., the preparation of the photosensitive liquid solution. Steps P302, P304, or P306, each include purchasing a commercially available metal alkoxide, free radical-susceptible monomer precursor, or solvent. Alternatively, these materials may be produced from other commercially available materials by conventional reactions. Each of steps P302, P304, or P306 may include obtaining a plurality of materials, e.g., a strontium alkoxide, a tantalum alkoxide, and a niobium alkoxide in step P302.

The metal alkoxide of step P302 preferably has a carbon number ranging up to seven. Thus, alcohol byproducts of substitution reactions that replace the alkoxide ligand will have a boiling point of less than about 120° C., and can be eliminated from solution at moderate distillation temperatures.

Any metal can be used in the reaction. Useful metals for practicing the present invention include the transition metals, especially, scandium, titanium, vanadium, chromium, manganese, iron, cobalt, nickel, copper, yttrium, zirconium, niobium, molybdenum, technetium, ruthenium, rhodium, palladium, silver, lanthanum, hafnium, tantalum, tungsten, rhenium, osmium, iridium, platinum, gold, and actinium; the lanthanide series metals, especially, cerium, praseodymium, neodymium, promethium, samarium, europium, gadolinium, terbium, dysprosium, holmium, erbium, thulium, ytterbium, and lutetium; the rare earth metals including calcium, strontium, barium, and radium; and the alkali metals including lithium, sodium, potassium, rubidium, cesium, and francium. Other metals for use in the present invention include magnesium, zinc, cadmium, aluminum, gallium, indium, thallium, germanium, lead, tin, antimony, and bismuth. Nonmetallic elements including selenium, tellurium, phosphorous, silicon, and boron are also useful in the present invention. Especially preferred metals include those that are used to form perovskites and layered superlattice materials, e.g., strontium, barium, zirconium, bismuth, lead, niobium, tantalum, tungsten, titanium, and other metals having similar radii and valences.

The free radical-susceptible monomer precursor of step P304 is preferably an alkenyl carboxylic acid derivative, and is most preferably a derivative of acrylic acid or its esters. A list of preferred acrylates includes the (2-methacryloxy) ethoxytriisopropoxides; trimethacrylatemethoxyethoxyethoxides; tetrakis(bis 2,2(allyloxymethyl)butoxides; methacrylate triisopropoxides; methacryloxyethylacetoacetates; phthalic acid acrylates; phthalic acid methacrylates; polyethyleneglycol methacrylates; polyethyleneglycol/polybutyleneglycol methacrylates; succinic acid acrylates; polyethyleneglycol methacrylates; polypropyleneglycol methacrylates; glycerol methacrylates; glycidyl acrylates; glycidyl methacrylates; 2-hydroxyethyl acrylates; 2-hydroxyethyl methacrylates; 2-hydroxypropyl acrylates; 2-hydroxypropyl methacrylates; 1,6 hexanediol diacrylates; pentaerythriol triacetates; triglycerol diacrylates; ethyleneglycol diacrylates; ethylene glycol dimethacrylates; glycerol acrylate/methacrylates; glycerol dimethacrylates; and glycerol triacrylates. Especially preferred acrylates include glydicidyl methacrylates, metal succinic acid monohydroxyethyl acrylates, metal salts of sorbic acid, metal 2-ethyl-2-hexenoates, and mixtures of these compositions. Vinylic metal complexes are preferred over regular alkenes, but are less preferred than acrylates. Metal N-vinyl-2-pyrrolidone complexes are especially preferred vinylic metal compositions.

Figure 6:
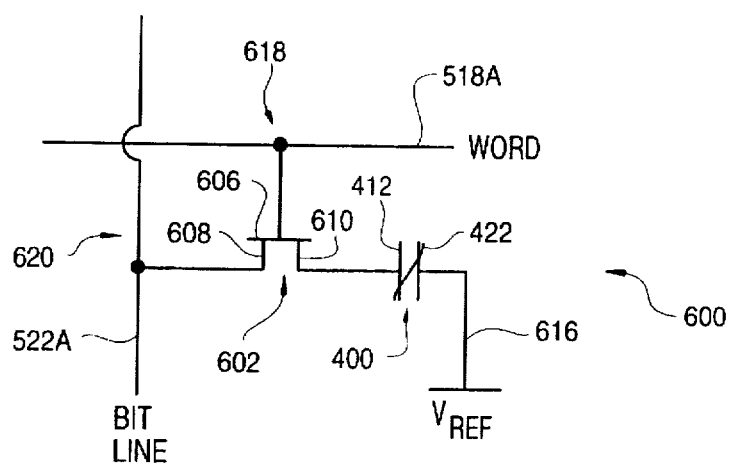
FIG. 6 depicts formulae for substituted alkene monomers.

The free radical-susceptible monomers for use in step P304 may be substituted derivatives of the above list of materials, i.e., functional homologues. For example, FIG. 6 shows several acrylates in substituted form. In FIG. 6, $R_1$ through $R_{12}$ are hydrogen or saturated or unsaturated hydrocarbon chains having a carbon number ranging from one to seven; and m is an integer. The total number of carbon atoms in $R_1$ through $R_{12}$ in any one compound preferably total to less than seven. FIG. 6(a) shows a formula for acrylate derivatives. FIG. 6(b) shows a formula for substituted polyethyleneglycol(meth)acrylate derivatives. FIG. 6(c) shows a formula for succinic acid polyethyleneglycol acrylate derivatives. FIG. 6(d) shows a formula for phthalic acid poylethyleneglycol acrylate derivatives. FIG. 6(e) shows a Formula for unsaturated carboxylic acid derivatives wherein R" is an alkenyl or alkynyl group having from one to eight carbon atoms. R" preferably has a conjugated system of alternating double bonds, e.g., —C=C—C=C—C=C—.

Preferred solvents for use in step P306 include 2-methoxyethanol, methylcyclohexane, n-octane, and n-decane. 2-methoxyethanol is most preferred because its polar nature enhances the solubility of reagents and reaction products. These solvents can be mixed as cosolvents.

In step P308, the ingredients corresponding to steps P302, P304, and P306 are stirred together to form a reaction mixture. The reaction mixture is preferably heated to a temperature ranging from about 100° C. to 120° C., and maintained at this temperature for forty eight hours. Step P308 is preferably combined with step P310, which includes distillation to eliminate from solution the water and alcohol reaction byproducts. The long reaction time combined with elimination of alcohol byproducts through distillation drives the reaction to substantial completion, i.e., substantially all of the alkoxide ligands are removed as the reaction mixture seeks equilibrium. The alcohol is also removed because its presence promotes esterification, which is associated with the production of water and consequent gelling of the solution. Steps P308 and P310 yield a metal alkoxy acrylate in solution. The molarity of the solution at this time may vary, but it is recommended that the solution be kept as concentrated as possible while solubilizing all of the reagents and products. The reaction product is a monomer that is susceptible to reaction with free radicals.

In step P312, other monomers (e.g., metal acrylates) are added to the solution. These other monomers are essentially free of water, and can be made as described in the discussion of steps P302–P310. The desiccated nature of the solution provides an extremely long shelf life of up to one year or more. As an alternative to step P312, a plurality of metal alkoxides may be added in step P302. Thus, the solution after step P310 includes all of the metals that are required to form the desired metal oxide pursuant to the anneal (step P218) of FIG. 2. Even so, it is not desirable to add a bismuth alkoxide in step P302 because bismuth-organic complexes are easily damaged by thermal stresses, and may dissociate in the distillation step P312. Thus, it is almost always preferably to add bismuth acrylates in step P312.

Step P314 includes dilution of the solution by adding more solvent. The solvent is preferably an anhydrous polar organic solvent, such as 2-methoxyethanol, which best solubilizes the reaction product. It is preferred to dilute the solution to a molarity of 0.05 mole percent to 0.2 mole percent based upon a desired empirical formula (see, e.g., Formulae (3)–(5) below). This dilution or molarity adjustment enhances the substrate-coating ability of the liquid solution. In this sense, the term "molarity" means the number of moles of the empirical formula of the desired metal oxide that may be produced in the anneal of step P218 (see FIG. 2) from a single liter of solution. It is advantageous to standardize a variety of solutions to a common molarity because one solution will then behave much like another in producing films of consistent quality and thickness without having to alter or optimize other process parameters, e.g., the soft bake, drying and anneal steps corresponding to numbers P208, P216, and P218 of FIG. 2. The diluted solution after step P314 may be shipped and stored for long periods of time, e.g., up to a year or more.

The photo initiator is preferably not added until step P316. The addition of a photo initiator makes the solution sensitive to light and, particularly, ultraviolet radiation. Thus, premature exposure of the solution to ultraviolet light must be avoided. The best way to assure that ultraviolet radiation does not impair the solution is to withhold the addition of the photo initiator until just before the application of the photosensitive liquid solution to the substrate in step P206. The photo initiator is any chemical that undergoes homolysis when exposed to ultraviolet radiation. Particularly preferred photo initiators include 1-hydroxydimethylmethylphenylketone, and other commercially available compounds that contain a carbonyl group, e.g., Suitable photo initiators include 1-hydroxydimethylmethylphenylketone, 2,2-dimethoxy-2-phenylacetophenone, 1-hydroxycyclohexylphenylketone, 2,2'-azobis(2-methylproionitrile), 2,2-diethoxyacetophenone, 1-phenyl-2-hydroxy-2-methylpropane-1-one, 2-methyl-1-(4-methylthiophenyl)-2-molphorino-propane-1-one, 2,4,6-(trimethyl)benzoil diphenylphosphine oxide, benzoin ethers, and hydroxyacetophenones. Exemplary benzoin ethers include methylbenzoinmethylether, ethylbenzoinethylether, butylbenzoinbutylether, and iso-butylbenzoinisobutylether. Exemplary hydroxyacetophenones include 2-hydroxy-2-methyl-1-phenyl-propane-1-one, 1-(3,4-dimethyl)-2-hydroxy-2-methyl-propane-1-one, and 1-(4-isopropyl)-2-hydroxy-2-methyl-propane-1-one. These materials are used in an amount ranging from about 0.01 mole percent to 0.2 mole percent of the final solution.

Figure 5:
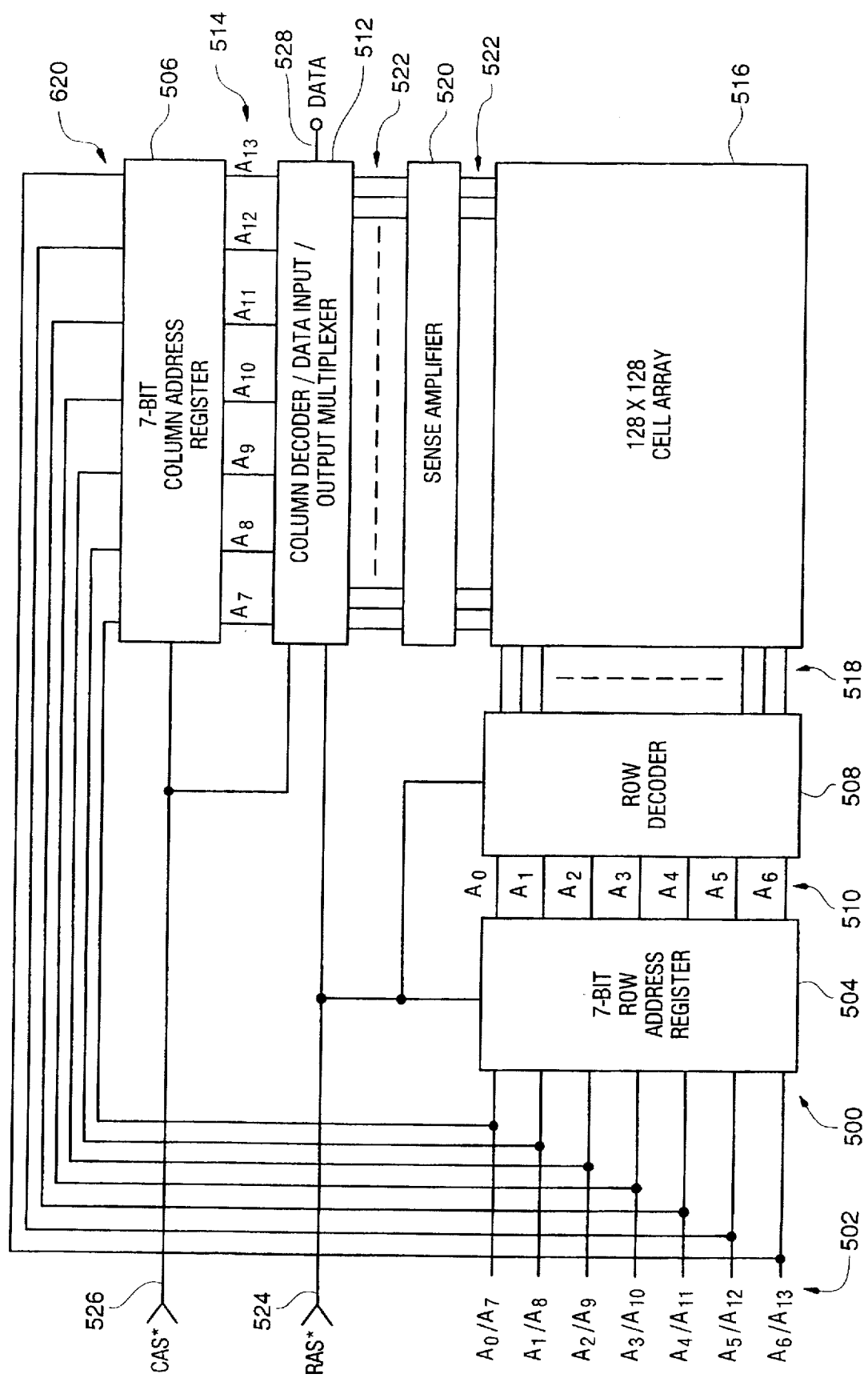
FIG. 5 depicts a generalized reaction for use in making metal alkoxy acrylates for use in the FIG. 4 process.

FIG. 5 depicts a generalized reaction for use in making metal alkoxy acrylates in step P308 of FIG. 4. In FIG. 5, M is any metal having a valence of n; a denotes the moles of acrylate added to M by the reaction; and R and R' are alkyl, alkenyl, carboxyl, acrylyl or combinations of these groups. R and R' preferably have a carbon number ranging from one to seven.

As indicated above, the photosensitive liquid solutions of process P300 are selectively mixed to provide a desired stoichiometry in the final metal oxide that is produced in the anneal step P218 of FIG. 2. Thus, the selection of ingredients for use in process P300 determines the metal oxide that results from step P218.

Combinations of metals that form $ABO_3$ perovskites, e.g., lead zirconium titanate and barium strontium titanate, are especially preferred for use in the present invention. In the $ABO_3$ formula, the letter A refers to an A-site position in the perovskite lattice, and the letter B refers to a B-site position in the perovskite lattice. Thus, A and B also include mixtures of A-site and/or B-site metals, e.g., AA'A"BB'B"$O_3$, where A, A'A', B, B', and B" are different metals.

Other especially preferred combinations of metals include those that form layered superlattice materials. All types of layered superlattice materials may be generally summarized under the average empirical formula:

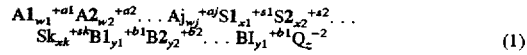

(1)

Note that Formula (1) refers to a stoichiometrically balanced list of superlattice-forming moieties. Formula (1) does not represent a unit cell construction, nor does it attempt to allocate ingredients to the respective layers. In Formula (1), A1, A2 ... Aj represent A-site elements in a perovskite-like octahedral structure, which includes elements such as strontium, calcium, barium, bismuth, lead, and mixtures thereof, as well as others metals of similar ionic radius. S1, S2 ... Sk represent superlattice generator elements, which preferably include only bismuth, but can also include trivalent materials such as yttrium, scandium, lanthanum, antimony, chromium, and thallium. B1, B2 ... Bl represent B-site elements in the perovskite-like structure, which may be elements such as titanium, tantalum, hafnium, tungsten, niobium, vanadium, zirconium, and other elements, and Q represents an anion, which preferably is oxygen but may also be other elements, such as fluorine, chlorine and hybrids of these elements, such as the oxyfluorides, the oxychlorides, etc. The superscripts in Formula (1) indicate the valences of the respective elements. The subscripts indicate the number of atoms of a particular element in the empirical formula compound. In terms of the unit cell, the subscripts indicate a number of atoms of the element, on the average, in the unit cell. The subscripts can be integer or fractional. That is, Formula (1) includes the cases where the unit cell may vary throughout the material, e.g. in $Sr_{0.75}Ba_{0.25}Bi_2Ta_2O_9$, on the average, 75% of the time Sr is the A-site atom and 25% of the time Ba is the A-site atom. If there is only one A-site element in the compound then it is represented by the "A1" element and w2 ... wj all equal zero. If there is only one B-site element in the compound, then it is represented by the "B1" element, and y2 ... y1 all equal zero, and similarly for the superlattice generator elements. The usual case is that there is one A-site element, one superlattice generator element, and one or two B-site elements, although Formula (1) is written in the more general form because the invention is intended to include the cases where either of the A and B sites and the superlattice generator can have multiple elements. The value of z is found from the equation:

$$(a1w1+a2w2 \ldots +ajwj)+(s1x1+x2x2 \ldots +skxk)+(b1y1+b2y2 \ldots +bjyj)=2z \quad (2)$$

The layered superlattice materials do not include every material that can be fit into Formula (1), but only those ingredients which spontaneously form themselves into a layer of distinct crystalline layers during crystallization. This spontaneous crystallization is typically assisted by thermally treating or annealing the mixture of ingredients. The enhanced temperature facilitates ordering of the superlattice-forming moieties into thermodynamically favored structures, such as perovskite-like octahedra.

The term "superlattice generator elements" as applied to S1, S2 ... Sk, refers to the fact that these metals are particularly stable in the form of a concentrated metal oxide layer interposed between two perovskite-like layers, as opposed to a uniform random distribution of superlattice generator metals throughout the mixed layered superlattice material. In particular, bismuth has an ionic radius that permits it to function as either an A-site material or a superlattice generator, but bismuth, if present in amounts less than a threshold stoichiometric proportion, will spontaneously concentrate as a non-perovskite-like bismuth oxide layer.

It should also be understood that the term layered superlattice material herein also includes doped layered superlattice materials. That is, any of the material included in Formula (1) may be doped with a variety of materials, such as silicon, germanium, uranium, zirconium, tin, chromium, dysprosium, or hafnium.

Formula (1) at least includes all three of the Smolenskii-type ferroelectric layered superlattice materials, namely, those having the respective formulae:

$$A_{m-1}S_2B_mO_{3m+3}; \quad (3)$$

$$A_{m+1}B_mO_{3m+1}; \text{ and} \quad (4)$$

$$A_mB_mO_{3m+2}, \quad (5)$$

wherein A is an A-site metal in the perovskite-like superlattice, B is a B-site metal in the perovskite-like superlattice, S is a trivalent superlattice-generator metal such as bismuth or thallium, and m is a number sufficient to balance the overall formula charge. Where m is a fractional number, the overall average empirical formula provides for a plurality of different or mixed perovskite-like layers. Materials according to Formula (3) above are particularly preferred because they produce layered perovskite-like oxygen octahedra structures that are intergrown with layers formed of metal oxides of the superlattice generating layer.

Terms of art that have been applied to these structures include layered perovskite-like materials, recurrent intergrowth layers, Aurivilius materials, and self-orienting spontaneous intergrowth layers. Even so, no one single term suffices to describe the entire class of layered superlattice materials. Applicants have chosen the term "layered superlattice materials" to describe the entire class of materials because the lattices include a short range order, e.g., a sublayer formed of a perovskite-like oxygen octahedra lattice, and a long range order including a periodic repetition of sublayers, e.g., a perovskite-like sublayer and a superlattice generator metal oxide layer repeated in succession. The dual order of these periodically repeating structures meets the definition of a superlattice. The term "layered superlattice material" should not be confused with forced heterolattice structures that are made by sputter deposition of successive layers. Layered superlattice materials spontaneously form collated intergrowth layers in an anneal, and do not require the forced deposition of successive layers.

The non-limiting examples shown below set forth preferred materials and methods for use in practicing the presently claimed invention.

EXAMPLE 1

PRODUCTION OF A PHOTOSENSITIVE STRONTIUM BISMUTH TANTALATE LIQUID SOLUTION

The following ingredients were purchased from the sources indicated in Table 1, and measured in the amounts shown.

TABLE 1

| Ingredient | Formula Weight (g/mol) | Grams | mmole | Vendor |
|---|---|---|---|---|
| strontium diisopropoxide | 205.80 | 2.09 | 10.16 | Strem |
| bismuth triethoxide | 344.16 | 9.33 | 27.11 | Vnipim |
| tantalum pentabutoxide | 546.52 | 12.35 | 22.60 | Vnipim |
| 1-hydroxy-cyclohexylphenylketone | 204.3 | 2.308 | 11.30 | Aldrich |

TABLE 1-continued

| Ingredient | Formula Weight (g/mol) | Grams | mmole | Vendor |
|---|---|---|---|---|
| methylmethacrylate | 100.12 | 23.5 (25 ml) | 235 | Aldrich |
| methylmethacrylate | 100.12 | 8.14 (8.7 ml) | 81.3 | Aldrich |

The tantalum pentabutoxide, strontium diisopropoxide, and 25 ml methylmethacrylate were mixed with 20 ml of 2-methoxyethanol solvent in a 300 ml Erlenmeyer flask fitted with a distillation head. The reaction mixture was heated to 120° C. for twenty four hours with constant magnetic stirring to make a homogenous solution. The large excess amount of methylmethacrylate and the long reaction time with distillation to eliminate water and alcohol (isopropyl and butyl) byproducts drove the reaction substantially to completion. The reaction product included tantalum and strontium alkoxy acrylates, and was concentrated by vacuum evaporation at 120° C. at 10–30 mm Hg for one hour to remove about 15 ml of solution. The concentrated pre solution stood until it reached room temperature.

The bismuth triethoxide was dissolved in 20 ml of 2-methoxyethanol at room temperature in a 300 ml Erlenmeyer flask fitted with a distillation head. A 8.7 ml quantity of methylmethacrylate was added, and the mixture was reacted at 60°–80° C. for twenty four hours with constant magnetic stirring. The reaction product contained a bismuth alkoxy acrylate, and was concentrated by vacuum evaporation at 60°–80° C. at 10–30 mm Hg for one hour to remove about 15 ml of a solution. The concentrated pre solution stood until it reached room temperature.

A photosensitive solution was prepared at room temperature by mixing the strontium and tantalum alkoxy acrylate pre solution with the bismuth alkoxy acrylate pre solution. The solution metals were present in proportions capable of yielding a metal oxide having the empirical formula $Sr_{0.853}Bi_{2.277}Ta_{1.893}O_9$. The pre formulation includes an approximate 14% excess bismuth amount and an approximate 2% excess tantalum amount as compared to Formula (3) above. These excess percentages account for anticipated metal volatilization losses in the anneal. Thus, the solution was designed to yield a strontium bismuth tantalate metal oxide corresponding to Formula (3). The 1-hydroxy-cyclohexylphenylketone was added to the solution at room temperature, and 2-methoxyethanol was added to adjust the molarity of the solution to 0.12 mmol per liter.

EXAMPLE 2

PRODUCTION OF A PHOTOSENSITIVE STRONTIUM BISMUTH NIOBIUM TANTALATE LIQUID SOLUTION

The following ingredients were purchased from the sources indicated in Table 2, and measured in the amounts shown.

TABLE 2

| Ingredient | Formula Weight (g/mol) | Grams | mmole | Vendor |
|---|---|---|---|---|
| strontium ethoxypropoxide | 205.80 | 3.03 | 10.17 | Strem |
| bismuth tri-t-pentoxide | 470.39 | 12.76 | 27.12 | Gelest |
| tantalum pentabutoxide | 546.52 | 7.41 | 13.56 | Vnipim |
| niobium pentabutoxide | 458.12 | 4.14 | 9.04 | Vinipim |
| 2,2 dimethoxy-2-phenylacetophenone | 256.3 | 2.90 | 1.30 | Aldrich |
| 2-ethyl-2-hexenoic acid | 142.20 | (33.25 ml) | 233.8 | Aldrich |
| 2-ethyl-2-hexenoic acid | 142.20 | (33.25 ml) | 80.2 | Aldrich |

The tantalum pentabutoxide, niobium pentabutoxide, strontium methoxypropoxide, and 25 ml 2-ethyl-2-hexenoic acid were mixed with 20 ml of 2-methoxyethanol solvent in a 300 ml Erlenmeyer flask fitted with a distillation head. The reaction mixture was heated to 120° C. for twenty four hours with constant magnetic stirring to make a homogenous solution. The large excess amount of 2-ethyl-2-hexenoic acid and the long reaction time with distillation to eliminate water and alcohol byproducts drove the reaction substantially to completion. The reaction product included tantalum, niobium, and strontium alkoxy acrylates, and was concentrated by vacuum evaporation at 120° C. and 10–30 mm Hg for 1.5 hours to remove about 15 ml of solution. The concentrated pre solution stood until it reached room temperature.

The bismuth tri-t-pentoxide was dissolved in 20 ml of 2-methoxyethanol at room temperature in a 300 ml Erlenmeyer flask fitted with a distillation head. A 25 ml quantity of 2-ethyl-2-hexenoic acid was added, and the mixture was reacted at 60°–80° C. for twenty four hours with constant magnetic stirring. The reaction product contained a bismuth alkoxy acrylate, and was concentrated by vacuum evaporation at 60°–80° C. and 10–30 mm Hg for 1.5 hours to remove about 15 ml of solution. The concentrated pre solution stood until it reached room temperature.

A photosensitive solution was prepared at room temperature by mixing the tantalum, niobium, and strontium alkoxy acrylate pre solution with the bismuth alkoxy acrylate pre solution. The solution metals were present in proportions capable of yielding a metal oxide having the empirical formula $Sr_{0.853}Bi_{2.272}Ta_{1.137}Nb_{0.758}O_9$. The pre formulation includes an approximate 14% excess bismuth amount and an approximate 2% excess B-site metal amount as compared to Formula (3) above. The B-site metals are split between tantalum (60%) and niobium (40%). These excess percentages account for anticipated metal volatilization losses in the anneal. Thus, the solution was designed to yield a strontium bismuth niobium tantalate metal oxide corresponding to Formula (3).

The 2,2 dimethoxy-2-phenylacetophenone was added to the solution at room temperature, and n-octane was added to adjust the molarity of the solution to 0.12 mmol per liter.

EXAMPLE 3

FORMATION OF A STRONTIUM BISMUTH NIOBIUM TANTALATE THIN FILM

The liquid solution of Example 2 was used to produce a thin film for use in integrated circuits. A polysilicon wafer at room temperature was placed into a conventional spin coater machine. A 2 ml quantity of the solution was dropped onto the wafer, and it was spun at 1500 rpm for thirty seconds to provide a uniform liquid film. The wafer was removed from the spin-coater and placed on a 100° C. hot plate in air for one minute to soft-bake the film. The wafer was removed from the hot plate and cooled in air to room temperature.

A photo mask was contact aligned with the wafer, and the wafer was exposed to 1000 mJ of deep ultraviolet radiation (250–300 nm wavelength) through the mask to initiate a free radical polymerization reaction in the soft-baked film. The UV-exposed wafer was developed with a developer solution consisting of a 1:1 mixture of 2-methoxyethanol and isopropyl alcohol. The wafer was placed in a room temperature bath of developer solution for sixty seconds to etch or remove unpolymerized portions of the film on the wafer.

The developed wafer included a negative pattern of the mask, and was placed to dry on a hot plate at 140° C. in air. The wafer was subjected to a second drying step by placing it on a hot plate at 260° C. in air. A third drying step included rapid thermal processing of the wafer at 725° C. under an oxygen flow of 5 cc/minute.

The dried wafer was placed in a diffusion furnace for an anneal. The anneal profile included and 800° C. maximum temperature for one hour including a ten minute push into the furnace and a ten minute pull out of the furnace. The resultant metal oxide thin film had the approximate empirical formula $Sr_{0.853}Bi_2Ta_{1.114}Nb_{0.743}O_9$, and was 2130 Å thick.

The process was repeated using the strontium bismuth tantalate of Example 1 to produce a metal oxide thin film that was 1990 Å thick.

EXAMPLE 4

EVALUATION OF THE STRONTIUM BISMUTH NIOBIUM TANTALATE THIN FILM FERROELECTRIC POLARIZATION

Capacitors including the respective thin films produced in Example 4 were subjected to polarization hysteresis measurements on an uncompensated Sawyer-Tower circuit including a Hewlit Packard 3314A function generator and a Hewlit Packard 54502A digitizing oscilloscope. Measurements were obtained from the film at 22° C. using a sine wave function having a frequency of 10.000 Hz. The capacitors each had an area of 7850 $um^2$.

Figure 7:
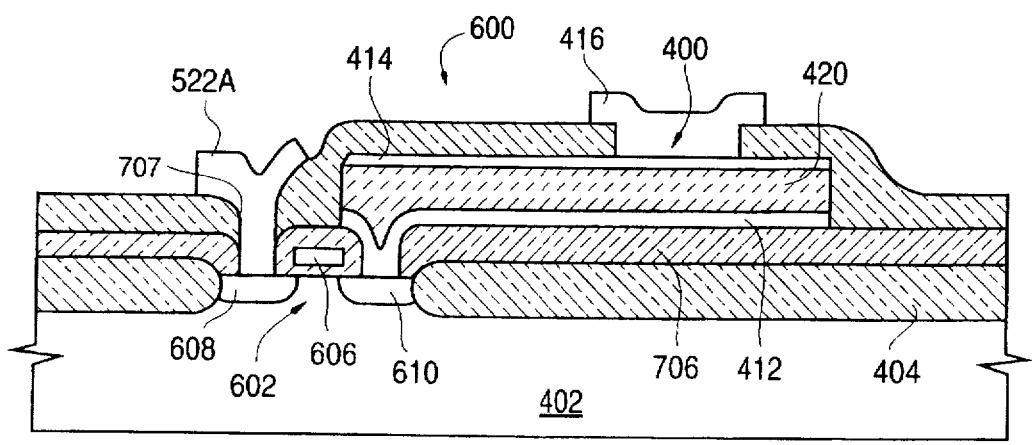
FIG. 7 depicts a ferroelectric polarization hysteresis curve taken from a strontium bismuth tantalate thin film sample.
Figure 8:
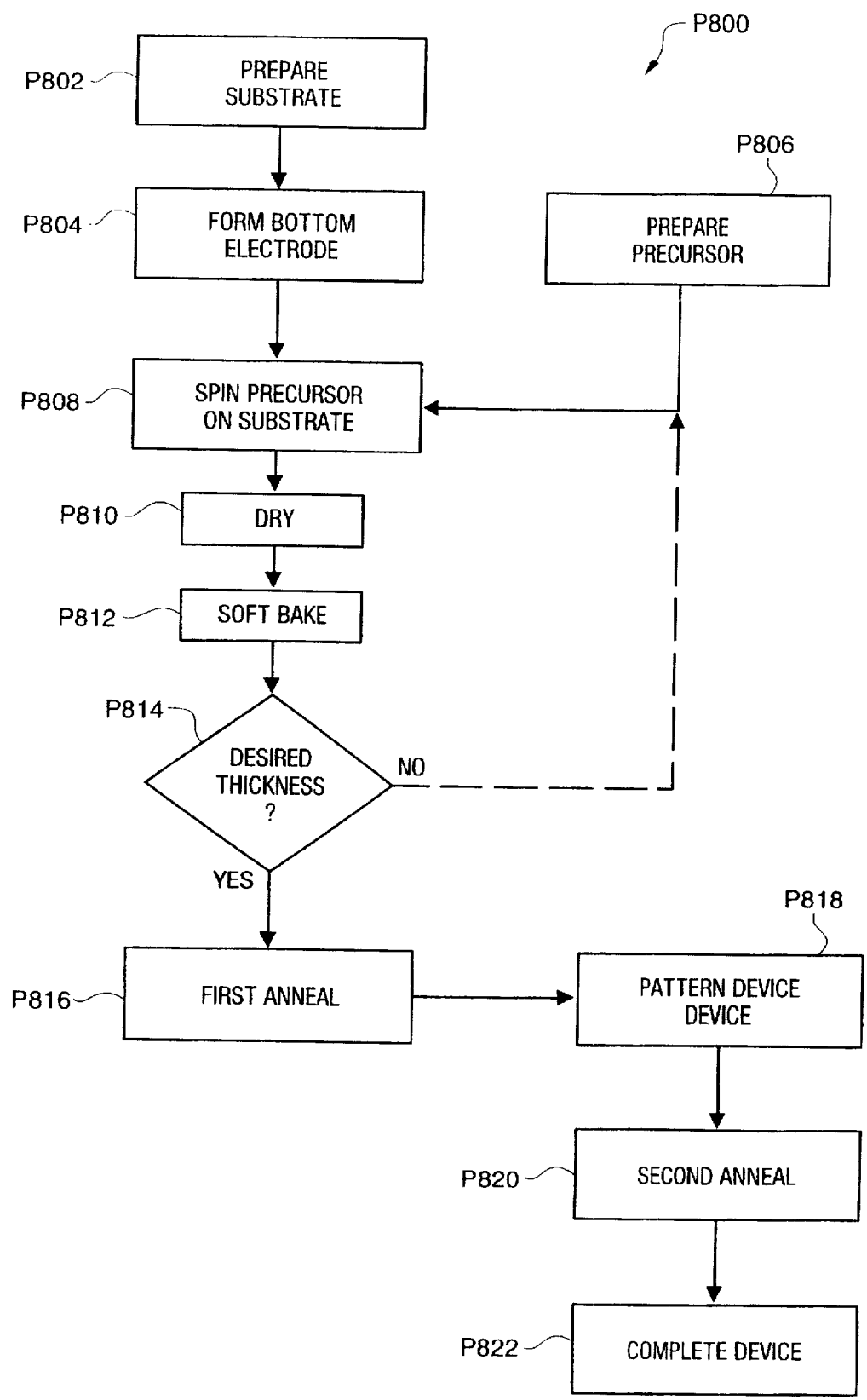
FIG. 8 depicts a ferroelectric polarization hysteresis curve taken from a strontium bismuth niobium tantalate thin film sample.

FIG. 7 depicts a plot of the data obtained as a polarization hysteresis curve for the strontium bismuth tantalate. The X-axis is an electric field in KV/cm, and the Y-axis is an observed remanent polarization in $\mu C/cm^2$. The steeply rising, quasi-rectangular, boxy nature of the hysteresis curve indicates an excellent ferroelectric memory-switching performance with a remanent polarization (2Pr) value up to about 17 $\mu C/cm^2$. Similarly, FIG. 8 depicts the polarization results for the strontium bismuth niobium tantalate sample. The FIG. 8 results also show excellent memory performance with a 2Pr polarization value of 21 $\mu C/cm^2$.

EXAMPLE 5

FILM PATTERNING RESOLUTION

Figure 9:
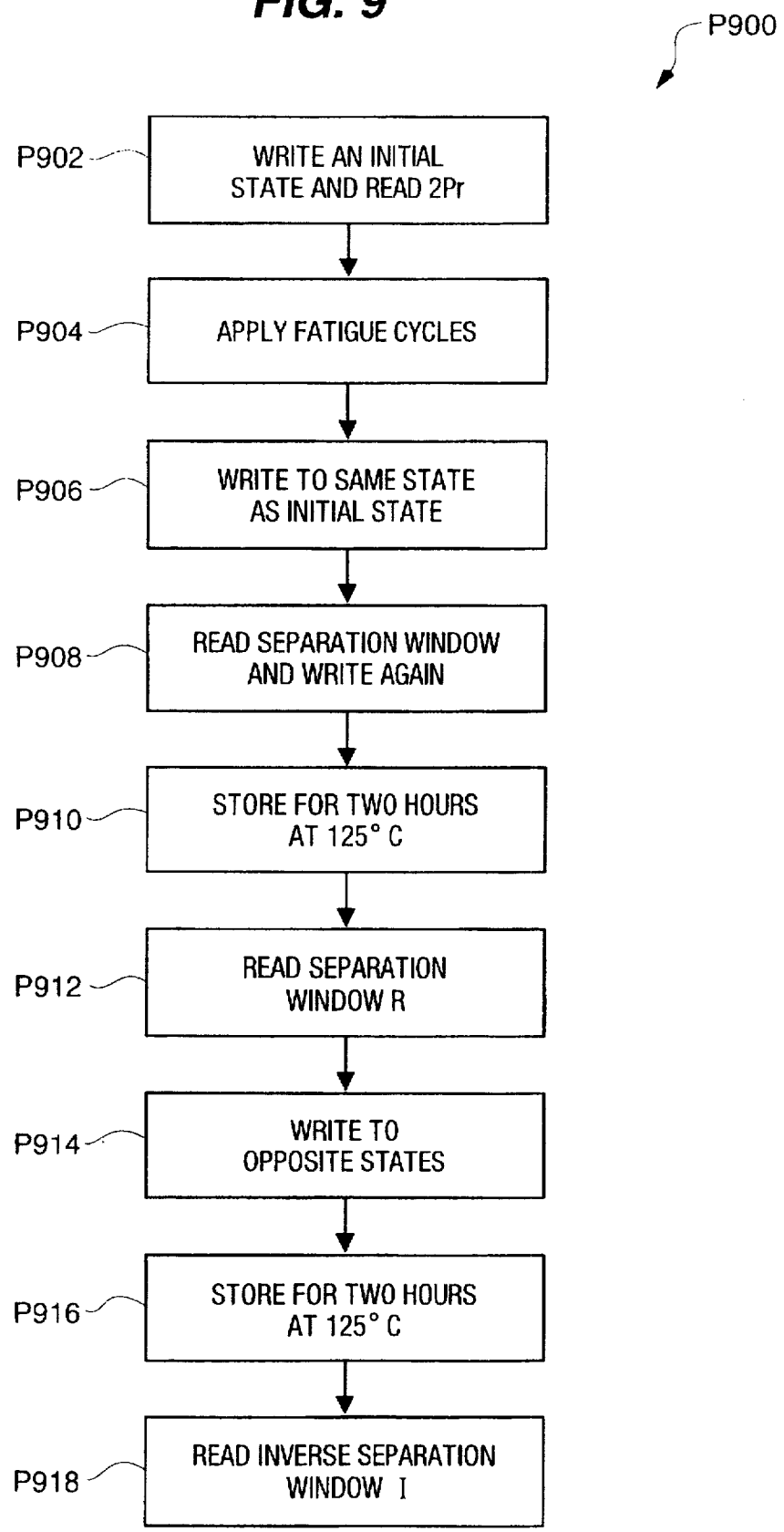
FIG. 9 depicts a scanning electron micrograph showing thin film microdot patterns produced according to the present invention.

FIG. 9 depicts a scanning electron micrograph of three dot patterns on a strontium bismuth tantalate film that was patterned according to the method of Example 3 to produce a plurality of 3×3 $um^2$ dots. Overall, the dots show uniform surface characteristics. Some tapering is evident at the outer margin of each dot, but these tapers are substantially free of bubbles or porosity.

Figure 10:
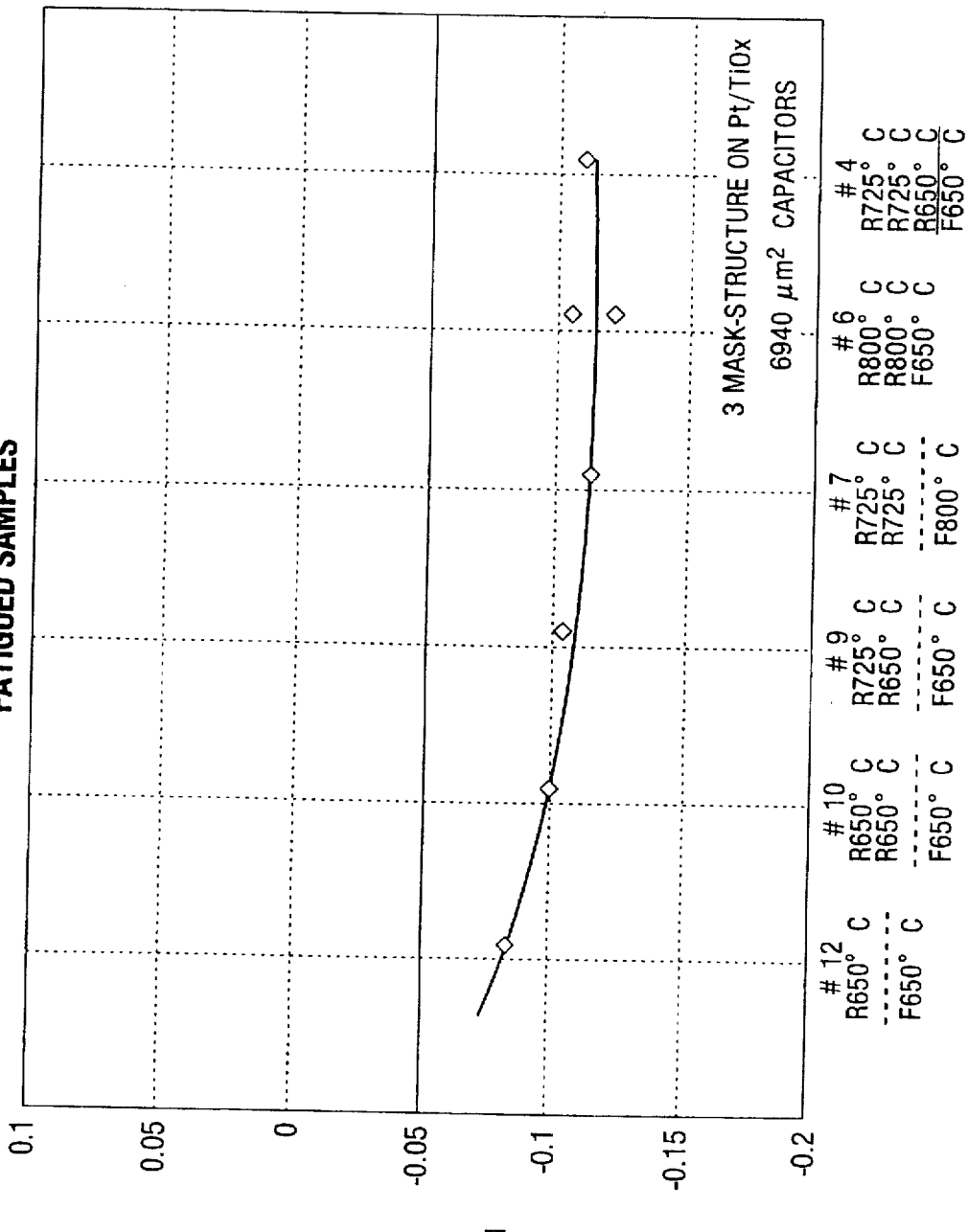
FIG. 10 depicts a scanning electron micrograph showing a pattern of very fine lines produced according to the present invention.

FIG. 10 depicts a scanning electron micrograph of a strontium bismuth tantalate film that was patterned according to the method of Example 3. In this case, the patterning process was used to etch a series of fine lines, e.g., lines 400 and 402 through the strontium bismuth tantalate film. FIG. 10 represents an area 3 um by 3 um. The finely etched patterns are excellent, and how good uniformity with no connective regions of unremoved material bridging the respective spaces across each line from one dark area to another dark area.

Those skilled in the art will understand that the preferred embodiments described above may be subjected to apparent modifications without departing from the true scope and spirit of the invention. The inventors, accordingly, hereby state their intention to rely upon the Doctrine of Equivalents, in order to protect their full rights in the invention.

We claim:

1. A method of making a thin film layer for use in integrated circuit devices and optics, said method comprising the steps of:

providing a substrate;

preparing a photosensitive liquid solution including a free radical photo initiator and at least one polymerizable composition having a metal bonded to a free radical-susceptible monomer;

applying said photosensitive liquid solution to said substrate to form a film of said photosensitive liquid solution on said substrate;

polymerizing a portion of said film via a photo-initiated free radical polymerization reaction in said composition; and developing a pattern in said film to leave said portion of said film on said substrate, wherein said step of preparing a photosensitive liquid solution includes mixing said photosensitive liquid solution to include a plurality of metals capable of yielding a solid ferroelectric metal oxide layered superlattice material compound during an anneal of said pattern in said film wherein said layered superlattice material compound has a plurality of metals in proportion of metals according to a formulae selected from the group consisting of $A_{m-1}S_2B_mO_{3m+3}$;

$A_{m+1}B_mO_{3m+1}$; and $A_mB_mO_{3m+2}$, wherein A is an A-site metal, B is a B-site metal, S is bismuth, and m is a number sufficient to balance the overall formula charge.

2. The method as set forth in claim 1 wherein said step of preparing said photosensitive liquid solution includes mixing said polymerizable composition to yield said layered superlattice material selected from the group consisting of strontium bismuth tantalate, strontium bismuth niobate, and strontium bismuth niobium tantalate.

3. The method as set forth in claim 1 wherein said step of preparing said photosensitive liquid solution includes use of said polymerizable composition selected from the group consisting of metal acrylates and their substituted derivatives; metal polyethyleneglycol(meth)acrylates and their substituted derivatives; metal phthalic acid polyethyleneglycol acrylates and their substituted derivatives; metal unsaturated carboxylic acids and their derivatives; ethyl acrylates; metal alkoxy acrylates; vinylic metal complexes; and mixtures thereof.

4. The method as set forth in claim 1 wherein said step of preparing said photosensitive liquid solution includes use of said composition selected from the group consisting of metal glydicidyl methacrylates; metal succinic acid monohydroxyethyl acrylates; metal salts of sorbic acid, metal 2-ethyl-2-hexenoates; and mixtures of these compositions.

5. The method as set forth in claim 4 wherein said composition is a metal N-2-vinylpyrrolidone compound.

6. The method as set forth in claim 1 wherein said step of preparing said photosensitive liquid solution includes use of said monomer selected from the group consisting of (2-methacryloxy)-ethoxytriisopropoxides; trimethacrylatemethoxyethoxyethoxides; tetrakis(bis 2,2(allyoxymethyl) butoxides; methacrylate triisopropoxides; methacryloxyethylacetoacetates; phthalic acid acrylates; phthalic acid methacrylates; polyethyleneglycol methacrylates; polyethyleneglycol/polybutyleneglycol methacrylates; succinic acid acrylates; polyethyleneglycol methacrylates; polypropyleneglycol methacrylates; glycerol methacrylates; glycidyl acrylates; glycidyl methacrylates; 2-hydroxyethyl acrylates; 2-hydroxyethyl methacrylates; 2-hydroxypropyl acrylates; 2-hydroxypropyl methacrylates; 1,6 hexanediol diacrylates; pentaerythriol triacetates; triglycerol diacrylates; ethyleneglycol diacrylates; ethylene glycol dimethacrylates; glycerol acrylate/methacrylates; glycerol dimethacrylates; and glycerol triacrylates.

7. The method as set forth in claim 1 wherein said step of preparing a photosensitive liquid solution includes reacting a metal alkoxide with an acrylate to yield said polymerizable composition as a metal alkoxy acrylate solution.

8. The method as set forth in claim 7 wherein said reacting step includes distilling said metal alkoxy acrylate solution to eliminate alcohol.

9. The method as set forth in claim 8 including a step of adding a bismuth acrylate to said metal acrylate solution after said distilling step.

10. The method as set forth in claim 1 wherein said preparing step includes adding said photo initiator selected from a group consisting of 1-hydroxydimethylmethylphenylketone, 2,2-dimethoxy-2-phenylacetophenone, 1-hydroxycyclohexylphenylketone, 2,2'-azobis(2-methylproionitrile), 2,2-diethoxyacetophenone, 1-phenyl-2-hydroxy-2-methylpropane-1-one, 2-methyl-1(4-methylthiophenyl)-2-molphorino-propane-1-one, 2,4,6-(trimethyl)benzoil diphenylphosphine oxide, benzoin ethers, and hydroxyacetophenones.

11. The method as set forth in claim 10 wherein said step polymerizing a portion of said film includes use of ultraviolet radiation to initiate said photo-initiated polymerization reaction.

12. The method as set forth in claim 11 wherein said step polymerizing a portion of said film includes use of said ultraviolet radiation having a wavelength ranging from 250–300 nm to deliver a total energy of at least 500 mJ.

13. The method as set forth in claim 1 wherein said step polymerizing a portion of developing a pattern in said film includes washing unpolymerized portions of said film away from said substrate to leave a patterned film on said substrate.

14. The method as set forth in claim 13 wherein said step of washing unpolymerized portions of said film includes use of a polar organic solvent.

15. The method as set forth in claim 1 including a step of annealing said film after said polymerizing step.

16. The method as set forth in claim 15 wherein said step of annealing said film includes annealing at a temperature ranging from 450° C. to 850° C.

17. The method as set forth in claim 1 wherein said step of applying said photosensitive liquid solution includes spin-on deposition of said photosensitive liquid solution to said substrate.

18. A thin film layer produced according to the method of claim 1.

19. A photosensitive liquid solution for use in making integrated circuits, comprising:

a polymerizable composition including at least one metal bonded to a free radical susceptible monomer;

a solvent mixed with a plurality of metal acrylates to a molarity of metals in said metal acrylates ranging from 0.01 mole percent to 0.2 mole percent based upon an empirical formula of a desired metal oxide to be produced from said photosensitive solution; and a photo polymerization initiator.

wherein said Plurality of metals of said polymerizable composition include a plurality of metals capable of yielding a solid ferroelectric metal oxide layered superlattice material compound during an anneal of said patterned film.

20. The solution as set forth in claim 19 wherein said plurality of metals of said polymerizable composition are present in proportions of A, B, and S according to a formulae selected from the group consisting of:

$A_{m-1}S_2B_mO_{3m+3}$;

$A_{m+1}B_mO_{3m+1}$; and $A_mB_mO_{3m+2}$.

wherein A is an A-site metal, B is a B-site metal, S is bismuth, O is oxygen, and m is a number sufficient to balance the overall formula charge.

21. The solution as set forth in claim 20 wherein said metal acrylates include metals selected from the group consisting of strontium, bismuth, tantalum, niobium, and mixtures thereof.

22. The solution as set forth in claim 19 wherein said polymerizable composition is selected from the group consisting of metal acrylates and their substituted derivatives; metal polyethyleneglycol(meta)acrylates and their substituted derivatives; metal phthalic acid polyethyleneglycol acrylates and their substituted derivatives; metal unsaturated carboxylic acids and their derivatives; ethyl acrylates; metal alkoxy acrylates; vinylic metal complexes; and mixtures thereof.

23. The solution as set forth in claim 19 wherein said polymerizable composition is selected from the group consisting of metal glycidyl methacrylates; metal succinic acid monohydroxyethyl acrylates; metal salts of sorbic acid, metal 2-ethyl-2-hexenoates; and mixtures thereof.

24. The solution as set forth in claim 19 wherein said polymerizable composition is a metal N-2-vinylpyrrolidone compound.

25. The solution as set forth in claim 19 wherein said monomer is selected from the group consisting of (2-methacryloxy)-ethoxytriisopropoxides; trimethacrylatemethoxyethoxyethoxides; tetrakis(bis 2,2(allyoxymethyl) butoxides; methacrylate triisopropoxides; methacryloxyethylacetoacetates; phthalic acid acrylates; phthalic acid methacrylates; polyethyleneglycol methacrylates; polyethyleneglycol/polybutyleneglycol methacrylates; succinic acid acrylates; polyethyleneglycol methacrylates; polypropyleneglycol methacrylates; glycerol methacrylates; glycidyl acrylates; glycidyl methacrylates; 2-hydroxyethyl acrylates; 2-hydroxyethyl methacrylates; 2-hydroxypropyl acrylates; 2-hydroxypropyl methacrylates; 1,6 hexanediol diacrylates; pentaerythriol triacetates; triglycerol diacrylates; ethyleneglycol diacrylates; ethylene glycol dimethacrylates; glycerol acrylate/methacrylates; glycerol dimethacrylates; and glycerol triacrylates.

26. The solution as set forth in claim 19 wherein said photosensitive liquid solution is essentially free of water.

27. The solution as set forth in claim 19 wherein said photo initiator is selected from a group consisting of 1-hydroxy-dimethylmethylphenylketone, 2,2-dimethoxy-2-phenylacetophenone, 1-hydroxy-cyclohexylphenylketone, 2,2'-azobis(2-methylproionitrile), 2,2-diethoxyacetophenone, 1-phenyl-2-hydroxy-2-methylpropane-1-ne, 2-methyl-1-(4-methylthiophenyl)-2-molphorino-propane-1-one, 2,4,6-(trimethyl)benzoil diphenylphosphine oxide, benzoin ethers, and hydroxyacetophenones.

28. The solution as set forth in claim 27 wherein said photo initiator is present in an amount ranging from 0.01 mole percent to 0.2 mole percent.

* * * * *